(12) United States Patent
Pupecki et al.

(10) Patent No.: US 10,771,873 B2
(45) Date of Patent: Sep. 8, 2020

(54) AUDIO DEVICE WITH CHARGING CONTACTS ON PRINTED CIRCUIT BOARD

(71) Applicant: Bose Corporation, Framingham, MA (US)

(72) Inventors: Jason R. Pupecki, Worcester, MA (US); David Kaphammer, Westborough, MA (US); Colin Taylor Mosgrove, Needham, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/448,606

(22) Filed: Jun. 21, 2019

(65) Prior Publication Data
US 2020/0221198 A1    Jul. 9, 2020

Related U.S. Application Data

(60) Provisional application No. 62/789,256, filed on Jan. 7, 2019.

(51) Int. Cl.
| | |
|---|---|
| *H04R 1/02* | (2006.01) |
| *H02J 7/00* | (2006.01) |
| *H04R 1/34* | (2006.01) |
| *H05K 1/18* | (2006.01) |
| *H05K 7/14* | (2006.01) |

(52) U.S. Cl.
CPC ............. *H04R 1/025* (2013.01); *H02J 7/00* (2013.01); *H02J 7/0042* (2013.01); *H04R 1/342* (2013.01); *H05K 1/189* (2013.01); *H05K 7/1427* (2013.01); *H04R 2201/029* (2013.01); *H04R 2420/09* (2013.01); *H05K 2201/10053* (2013.01)

(58) Field of Classification Search
CPC .... H04R 1/025; H04R 1/342; H04R 2420/09; H04R 2201/029; H02J 7/00; H02J 7/0042; H05K 1/189; H05K 7/1427; H05K 2201/10053
See application file for complete search history.

(56) References Cited

U.S. PATENT DOCUMENTS

| | | | | |
|---|---|---|---|---|
| 2007/0093279 | A1* | 4/2007 | Janik | H04M 1/6066 455/569.1 |
| 2014/0321686 | A1* | 10/2014 | Wegener | H04R 1/028 381/332 |
| 2015/0194833 | A1* | 7/2015 | Fathollahi | H02J 7/0044 320/114 |

(Continued)

*Primary Examiner* — Tuan D Nguyen

(57) ABSTRACT

An audio device with charging contacts on a printed circuit board (PCB) is described herein. In some implementations, the charging contacts are on a surface of the PCB that is a bottom external surface of the audio device, thereby eliminating the need for a custom connector block. Thus, cost and height savings can be realized. In some implementations, the charging contacts are designed to enable 360 degree docking ability with a charging dock. This can be achieved using one or more ring-shaped charging contacts that make physical contact with spring-loaded pins on the charging dock in any relative axial alignment. In some implementations, the audio device includes a mating feature configured to mate with a mating feature of the charging dock to help ensure a proper charging connection is made and to help physically center the audio device relative to the charging dock.

20 Claims, 8 Drawing Sheets

(56) References Cited

U.S. PATENT DOCUMENTS

| | | | |
|---|---|---|---|
| 2015/0245126 A1* | 8/2015 | Shaffer | H04R 1/1025 381/74 |
| 2016/0134959 A1* | 5/2016 | Shaffer | H04R 1/1025 381/74 |
| 2017/0093198 A1* | 3/2017 | Graham | H01F 38/14 |
| 2019/0069078 A1* | 2/2019 | Johnson | H04R 1/345 |

* cited by examiner

AUDIO DEVICE WITH CHARGING CONTACTS ON PRINTED CIRCUIT BOARD

CROSS-REFERENCE TO RELATED APPLICATION

This application claims priority of Provisional Patent Application Ser. No. 62/789,256, filed on Jan. 7, 2019, the entire disclosure of which is incorporated herein by reference for all purposes.

BACKGROUND

This disclosure relates to electrically charging electronic devices, such as an audio device.

SUMMARY

All examples and features mentioned below can be combined in any technically possible way.

In one aspect, an audio device includes: a housing; one or more loudspeakers within the housing; one or more batteries within the housing; battery charging circuitry within the housing and electrically coupled to the one or more batteries; and a printed circuit board (PCB) at least partially within the housing, the PCB including charging contacts on a surface of the PCB, and the charging contacts are electrically coupled to the battery charging circuitry.

Examples may include one of the following features, or any combination thereof.

In some examples, the charging contacts and at least a portion of the surface of the PCB form an outer surface of the audio device.

In some such examples, the outer surface of the audio device is a bottom surface of the audio device.

In some examples, the charging contacts include: a first charging contact; a second charging contact around the first charging contact; and a third charging contact around the second charging contact.

In some such examples, the second and third charging contacts are ring-shaped, and/or the first, second, and third charging contacts are configured to electrically couple to bus power, ground return, and configuration channel.

In some examples, the charging contacts are configured to be in electrical connection with a Universal Serial Bus (USB) Type-C (USB-C) connector.

In some examples, the charging contacts include gold.

In some examples, the charging contacts are hard gold plated with a gold thickness of 0.5 to 1.5 micrometers.

In some examples, the surface of the PCB is substantially flat.

In some examples, a gasket is included between the PCB and the housing.

In some examples, at least a portion of the surface of the PCB that forms an outer surface of the audio device is painted.

In some examples, the audio device is configured to rest on a charging dock, the charging dock including three electrical pin connections configured to make physical contact with the charging contacts when the audio device is rested on the charging dock.

In some examples, the housing includes a concave portion originating at a bottommost surface of the housing and terminating at an opening, the opening exposing the at least a portion of the surface of the PCB and the charging contacts.

In another aspect, an audio device includes a housing; one or more loudspeakers within the housing; one or more batteries within the housing and electrically coupled to the one or more loudspeakers; battery charging circuitry within the housing and electrically coupled to the one or more batteries; and a printed circuit board (PCB) at least partially within the housing, the PCB including charging contacts on a surface of the PCB, the charging contacts electrically coupled to the battery charging circuitry.

Examples may include one of the above and/or below features, or any combination thereof.

In some examples, at least a portion of the surface of the PCB in combination with the charging contacts form a bottom-facing, outer surface of the audio device.

In some examples, at least one of the charging contacts is elliptical.

In some examples, at least one of the charging contacts is circular.

In some examples, at least two of the charging contacts are circular.

In some examples, the charging contacts include a first distinct charging contact, a second distinct charging contact inside of the first distinct charging contact, and a third distinct charging contact inside of the second distinct charging contact.

In another aspect, a system includes: an audio device including a housing, one or more loudspeakers within the housing, one or more batteries within the housing, battery charging circuitry within the housing and electrically coupled to the one or more batteries, and a printed circuit board (PCB) at least partially within the housing, the PCB including charging contacts on a surface of the PCB, the charging contacts electrically coupled to the battery charging circuitry; and a charging dock including charging connectors.

Examples may include one of the above and/or below features, or any combination thereof.

In some examples, the charging connectors of the charging dock are configured to make physical contact with the charging contacts of the audio device in any relative radial orientation about an axis when the audio device is mated with the charging dock.

In some such examples, the axis is the main axis of the housing of the audio device.

In some examples, the electrical connectors of the charging dock are spring-loaded pins.

In some examples, the charging dock includes a switching circuit configured to sense the configuration channel of a received Universal Serial Bus (USB) Type-C (USB-C) connector in either orientation, and route the sensed configuration channel of the USB-C connector to at least one of the electrical connectors of the charging dock.

In another aspect, a method includes forming the audio device, charging dock, or system as variously described herein.

In some examples, implementations include one of the above and/or below features, or any combination thereof.

DETAILED DESCRIPTION

Figure 1:
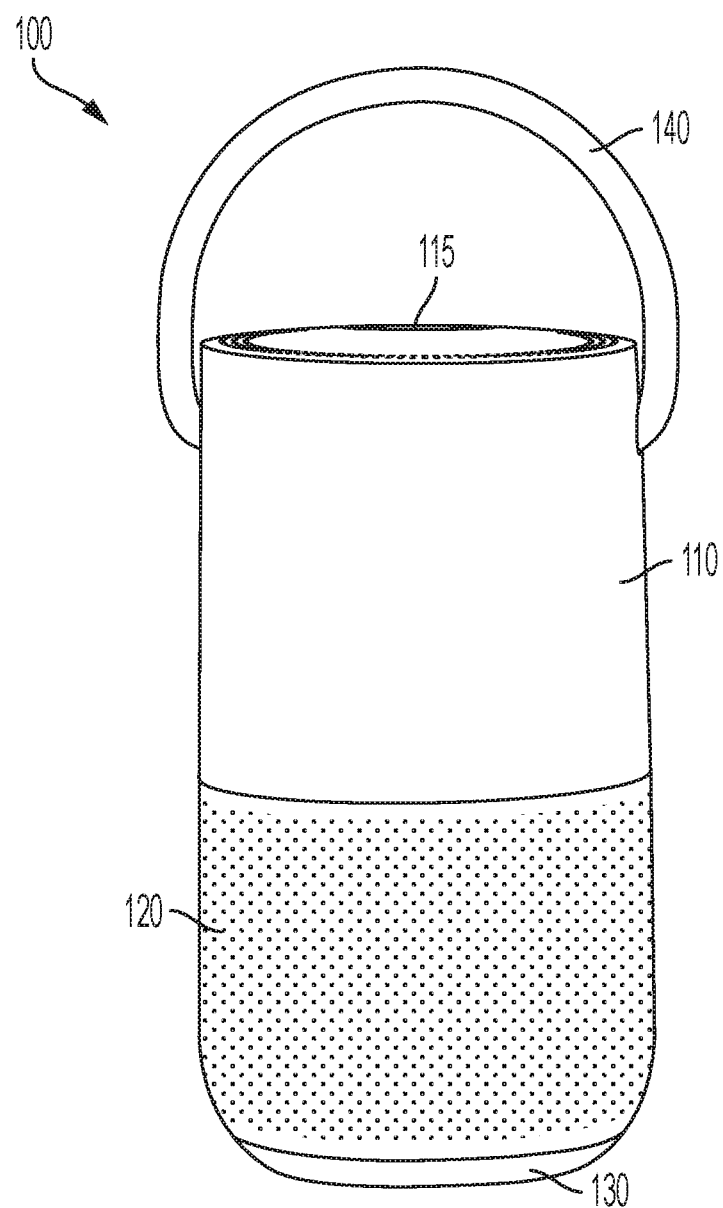
FIG. 1 illustrates a side perspective view of an audio device, according to various implementations.

Some electronic devices include one or more rechargeable batteries. In some cases, the electronic devices are designed such that the one or more rechargeable batteries are not intended to be removed from the electronic device. In other words, the rechargeable batteries may be internal to the housing of the electronic device, requiring at least one charging connection to enable charging the batteries. For instance, portable audio devices, such as loudspeakers having Bluetooth connectivity capabilities, may include a charging port to allow a charging cable to connect to the audio device and charge the included rechargeable batteries. Such charging cables can include Universal Serial Bus (USB) connectors, such as Micro-USB and USB Type-C (USB-C) connectors.

In some cases, electronic devices that include internal, rechargeable batteries are designed to work with a charging dock. A charging dock can provide a primary or supplemental method of charging the electronic device. For example, some audio devices are designed to interface with a charging dock to facilitate battery charging. Operation typically includes resting the audio device on the charging dock and aligning the electrical charging contacts of the audio device with the connectors of the charging dock. If the charging dock is connected to a power source (e.g., a wall outlet) and powered on, placing the audio device on the charging dock in the right orientation typically initiates charging of the rechargeable batteries within the audio device. However, designing and manufacturing an electronic device, such as a portable audio device, to interface with a charging dock adds complexity, cost, and other considerations. Further, having to axially align a device to its charging dock (e.g., by rotating the device about its main axis until the charging contacts line up with the connectors of the charging dock) detracts from the user experience. Moreover, misalignment of such a device relative to its charging dock will result in the device not charging as expected, further detracting from the user experience.

Thus, this disclosure describes an improved design for charging contacts for an electronic device. For example, in at least some implementations, the charging contacts are formed on a surface of a printed circuit board (PCB) that is an external surface of the electronic device. This provides cost-effective benefits, as PCBs are inexpensive and easily accessible. For instance, in some implementations, the cost savings are at least 50 percent relative to other configurations. In addition, by forming the charging contacts on an external surface of the PCB, such a configuration eliminates the cost or complexity of adding additional componentry, such as a connector block that would be custom designed to fit the specifications of the given audio device.

Further, utilizing the PCB for the charging contacts provides relative form factor savings compared to other configurations. For instance, in some implementations, the charging contacts described herein are formed on a PCB having a thickness less than 3 millimeters (mm) or less than 2 mm, such as a PCB having a thickness of approximately 1.57 mm (e.g., 1.5 to 1.65 mm). A custom connector block charging contact configuration may have a thickness greater than 3 mm, such that use of a PCB as variously described herein can provide at least 30, 40, 50, or 60 percent savings in thickness. Such a thickness savings can translate to savings in overall vertical height of the audio device. This is notable, as it is generally desirable to form audio devices, and especially portable audio devices, with as small a form factor as possible. Further still, in some implementations, the PCB provides mechanical support for the audio device, such as preventing other internal componentry from being exposed and/or supporting other circuitry thereon (in addition to the charging contacts). Other benefits of forming charging contacts on an external or exposed surface of a PCB will be apparent in light of this disclosure.

In at least some implementations, the charging contacts described herein are formed to enable 360-degree mateability with a corresponding charging dock. In other words, in such implementations, the charging contacts (and the connectors on the charging dock) are designed such that the audio device can be placed on the charging dock in any relative axial orientation (or rotation about a main body axis) and still be able to charge. The ability to mate the audio device with its charging dock regardless of the relative rotational state provides an enhanced user experience, as the user can intuitively place the audio device on the charging dock without having to be axially align the audio device relative to the charging dock. Moreover, such a feature of the audio device and charging dock increases the probability that the charging contacts on the audio device will make proper contact with the connectors of the charging dock, thereby further enhancing the user experience. In addition, for audio devices that produce omnidirectional sound (such as the one primarily depicted and described herein), such a 360-degree mateability feature does not detract from the audio experience when listening to the loudspeaker when docked, as the sound is output the same (or at least substantially the same) in all directions.

In at least some implementations, the audio device includes a first mating feature configured to fit with a second mating feature of the charging dock. For instance, the portable audio device primarily depicted and described herein includes a female mating feature or a concave feature that is configured to mate with a male mating feature or a protrusion of the charging dock. Such male and female mating features can physically center the audio device to the charging dock, thereby ensuring that a proper charging connection is made between the charging contacts of the audio device and the connectors of the charging dock. Another benefit of the mating features includes increased stability when the audio device is docked on the charging dock, as the protrusion of the charging dock resting in the concavity of the bottom of the audio device can help prevent the audio device from falling or being knocked from the charging dock. In addition, the concave mating feature on the bottom of the audio device can help protect the charging contacts from environment, as the charging contacts are raised up from the bottom-most surface of the audio device. Being elevated in such a manner can help protect against physical contact damage with other surfaces, liquid exposure (e.g., if the audio device is sitting in water or other liquid), and other elements (e.g., dirt or sand). This is especially important for a portable audio device, such as the one described herein, as it can help keep the charging contacts clean and unaltered despite continual movement of the audio device, thereby extending the lifetime of the contacts.

Note that although the electronic device primarily depicted/described herein is an audio device, and more specifically, a portable loudspeaker, the present disclosure is not intended to be so limited. For example, in some implementations, the charging contact configurations described herein can be used for other electronic devices, including, but not limited to: smart devices, such as smartphones, smartwatches, and other smart wearable devices; portable computers, such as tablet and laptop computers; computer peripherals, such as keyboards and mice; video game peripherals, such as controllers; and any other device that utilizes at least one PCB. Also note that although the charging contacts are primarily depicted/described herein as being a feature of the audio device and the charging connectors are primarily depicted/described herein as being a feature of the charging dock, in some implementations, the configuration is switched such that the audio device includes charging connectors (e.g., pogo pins or posts) and the charging dock includes charging contacts. Further note that although the mating feature of the audio device is primarily depicted/described herein as being a female feature (e.g., a concavity or socket) and the mating feature of the charging dock is primarily depicted/described herein as being a male feature (e.g., a protrusion or plug), in some implementations, the configuration is switched such that the audio device includes a male mating feature and the charging dock includes a female mating feature. In any such implementations, the male and female mating features (or first and second mating features, such as in the case of hermaphroditic connectors) are configured to interact to provide one or more benefits (e.g., self-centering, increased stability, environmental protection). Further note that although the mating features are primarily depicted/described herein as single features (i.e., one protrusion and one concavity), in other implementations, multiple first (or female) and/or second (or male) mating features are included. Understandably, in other implementations, the audio device simply rests on the charging dock to make a connection between the corresponding charging contacts/connectors, without any mating therebetween. Numerous configurations and variations will be apparent in light of this disclosure.

FIG. 1 illustrates a side perspective view of an audio device 100, according to various implementations. In some cases, audio device 100 includes a portable audio device such as a tabletop or handheld speaker that has capability for hard-wired and/or battery-powered operation. As shown in FIG. 1, audio device 100 includes upper enclosure 110, grille portion 120, external bottom cap 130, and handle 140. Together, upper enclosure 110, grille portion 120, and external bottom cap 130 provide the housing for audio device 100.

In this implementation, audio device 100 is a portable loudspeaker device, including a rechargeable battery for power and capable of outputting sound via a transducer. As audio device 100 is portable in this implementation, handle 140 is provided to help facilitate transport of the audio device 100. Handle 140 is attached using eyelet 142. In other implementations, audio device 100 does not include handle 140.

In some cases, upper enclosure 110, grille portion 120, and bottom cap 130 contain speaker components, such as one or more transducers, resonators, digital signal processors (DSPs), and/or related control circuitry, as will be apparent in light of this disclosure. Grille portion 120 can include holes or openings to facilitate audio output from the speaker contained therein (such as is shown in FIG. 1). Upper enclosure 110 can include keypad 115 for actuating functions of the audio device 100, such as playback functions, volume control, device pairing, toggling connectivity (e.g., Wi-Fi or Bluetooth), and so forth. In some instances, keypad 115 includes one or more selectable keys, buttons, or other control features for interacting with the audio device 100 (e.g., to actuate the previously described functions). In some implementations, one or more portions of keypad 115 are illuminable. In some such implementations, keypad 115 includes a light ring and/or other lights that illuminate to provide various functions, such as to inform the user of a status or setting of the audio device (e.g., that the power is on or the battery is charging), for entertainment purposes (e.g., by syncing with audio output or to provide animations), for functional light output (e.g., as a night light or to identify the location of the speaker), and so forth.

Figure 2:
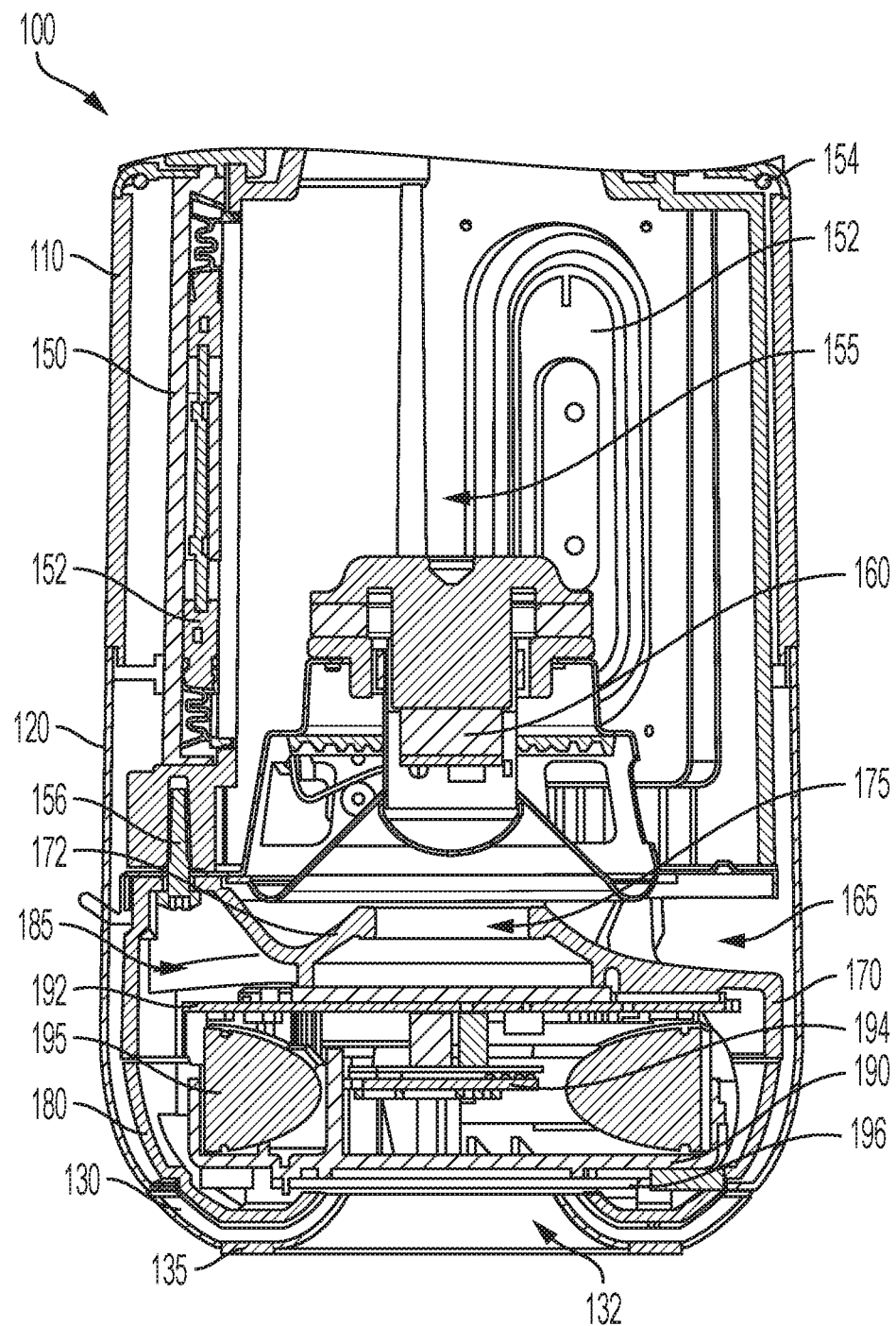
FIG. 2 illustrates a cross-sectional view of the audio device of FIG. 1.
Figure 3:
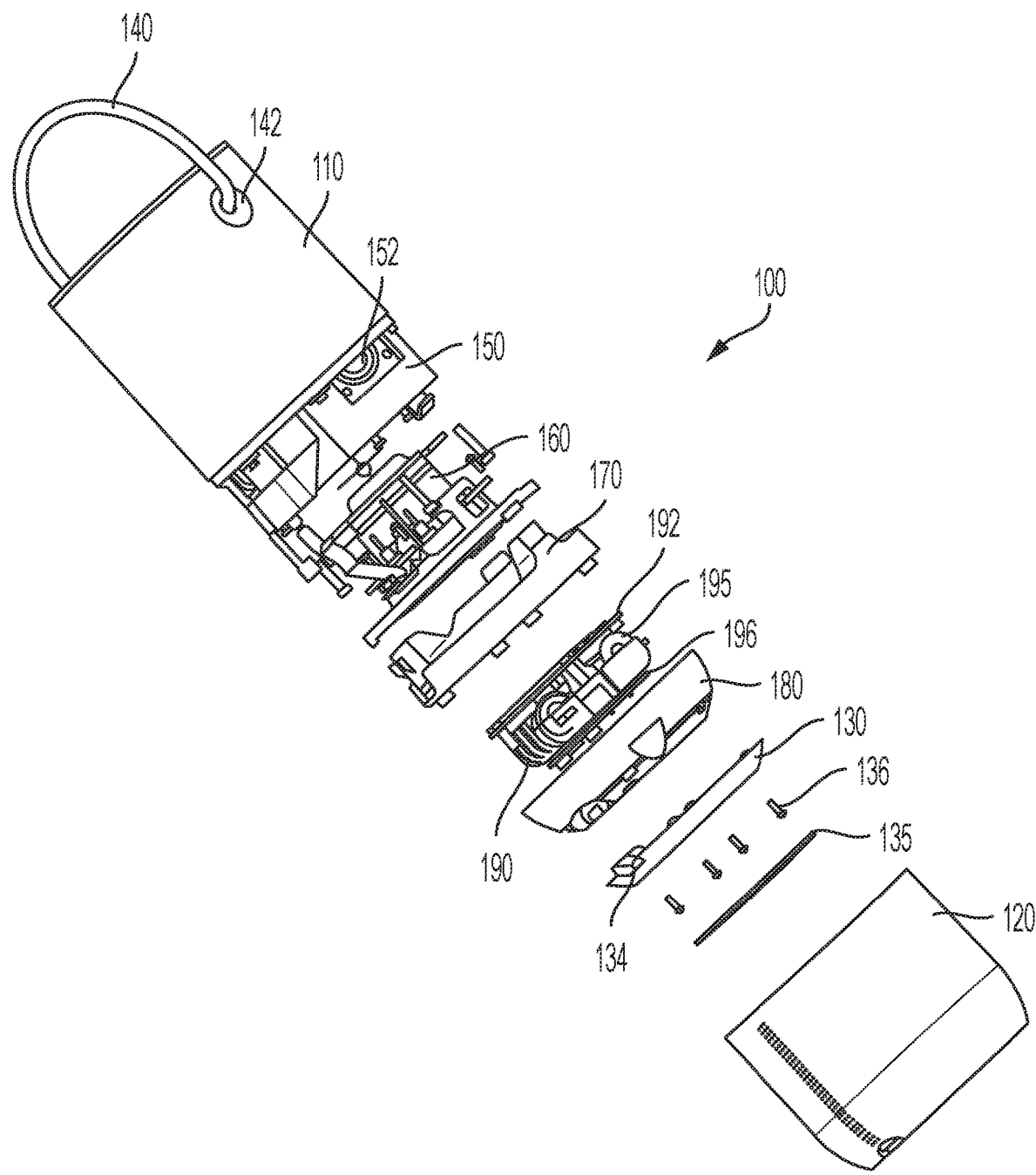
FIG. 3 illustrates an exploded view of the audio device of FIG. 1.

FIGS. 2 and 3 illustrate cross-sectional and exploded views, respectively, of audio device 100, according to various implementations. The internal components of audio device 100 include acoustic enclosure 150, transducer or speaker 160, acoustic deflector 170, battery pack subassembly 190, and internal bottom cap 180. Internal bottom cap provides structural support for audio device 100. Audio device 100 also includes foot 135 which can provide a higher-friction resting surface for audio device 100 and/or assist with covering and providing access to fasteners (e.g., screws) 136, in this example implementation. However, in other implementations, foot 135 may be integral to another feature (e.g., external bottom cap 130) or may not be present at all. Note that the features of audio device 100 can be assembled using any suitable methods, such as utilizing screws (e.g., screws 136 and 156, as well as other screws shown in the figures) and/or other fasteners or methods of joining material (e.g., adhesives, friction/snap fit, soldering, etc.).

Battery pack subassembly 190, in some implementations, includes one or more batteries 195, and circuitry related to same, such as power management and recharging circuitry. The one or more batteries 195 can include any suitable rechargeable battery type and technology, such as those that utilize lithium-ion (or lithium-ion polymer), nickel (e.g., nickel metal hydride or nickel-cadmium), alkaline, lead acid, or other suitable chemistries. The battery-related circuitry can be distributed between one or more PCBs included in audio device 100, such as upper PCB 192, center PCB 194, and lower PCB 196, which are all included with battery pack subassembly 190. In this example implementation, upper PCB 192 is a power board and lower PCB 196 includes charging connectors for electrically charging the battery(ies) 195, as is described in more detail herein. Audio device 100 also includes charging port access 134 in external bottom cap 130 for accessing an alternative charging method, which includes being able to plug a cable connector (e.g., USB, such as USB-C) directly into the audio device 100 in this example implementation (as opposed to using the charging dock configuration described herein). However, in other implementations, such an alternative charging method need not be included or even more alternative charging methods may be included.

Transducer or speaker 160 operates to produce sound, which travels through cavity 165 (between the speaker 160 and the acoustic deflector 170) and then through the holes in grille 120. Passive radiators 152 are arranged around, and seal slots within, the acoustic enclosure 150. In this implementation, three passive radiators 152 are employed; in other implementations, no passive radiators 152 or a different number of passive radiators (e.g., 1, 2, 4, or 5) can be employed. As shown, speaker 160 fires downward, toward acoustic deflector 170 to provide omnidirectional sound. However, the present disclosure is not intended to be so limited, as other implementations may include more transducers and/or may direct sound in a directional manner. In some implementations, deflector 170 includes opening 175 which can facilitate a convective or airflow-based cooling effect to the battery pack subassembly 190 during operation of the speaker 160 (e.g., during audio playback). In other implementations, deflector 170 need not include any openings across from the speaker 160 (such that opening 175 is not present) or additional openings may be included.

Figure 4:
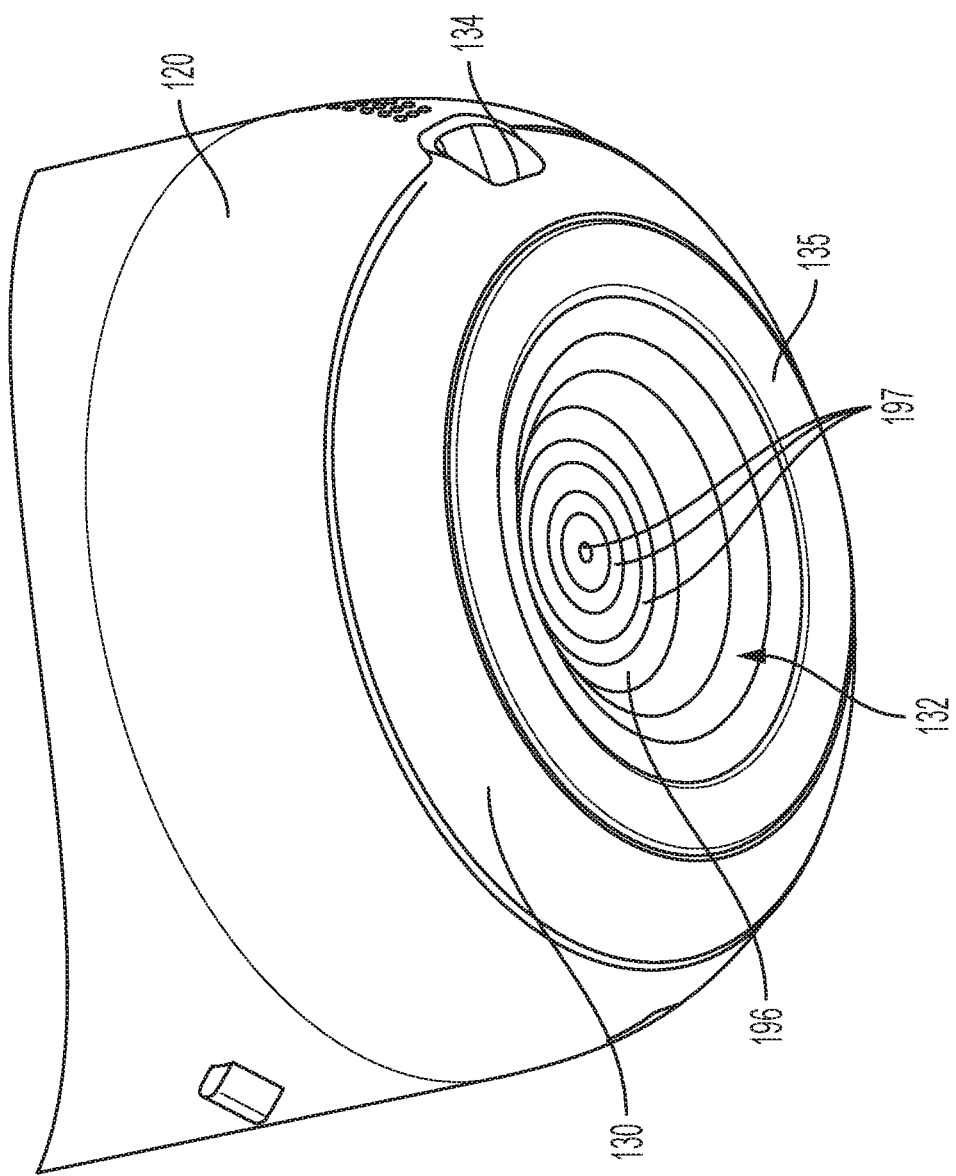
FIG. 4 illustrates a perspective view of a bottom portion of the audio device of FIG. 1.

FIG. 4 illustrates a perspective view of a bottom portion of audio device 100, according to various implementations. As shown in FIG. 4, a lower portion of grille 120 is provided, along with the external bottom cap 130 and foot 135. From the inside of foot 135, a mating feature 132 of external bottom cap 130 extends upward toward an opening. Mating feature 132 is a first mating feature configured to mate with a second mating feature 222 of charging dock 200. In this implementation, the opening at the end of mating feature 132 reveals lower PCB 196. Further, charging contacts 197 are on the portion of lower PCB 196 exposed by the opening in mating feature 132. Thus, a portion of lower PCB 196, as well as charging contacts 197, make up an external surface of audio device 100, such that the charging contacts 197 are exposed and can make physical contact with charging connectors (e.g., pogo pins) 234 of its corresponding charging dock 200, as is described in more detail below.

Charging contacts 197 can include any suitable material, such as one or more conductors, and more specifically, one or more metals. In one example, charging contacts 197 include gold (e.g., gold-plated or gold alloyed), while in another example, charging contacts 197 are entirely comprised of gold. Where charging contacts 197 include gold, they can have a thickness of 0.5 to 1.5 micrometers, or more specifically, 0.8 to 1.3 micrometers, in some implementations. Where charging contacts 197 include gold, formation may include hard gold deposition, which can help make the charging contacts more robust and hold up to friction from charging connectors (e.g., pogo pins) 234. However, where charging contacts 197 include gold, other formation processes may be used, such as electroless nickel immersion gold (ENIG) processing. Other suitable materials may include one or more of copper, silver, or nickel, in some example implementations.

In the example implementation illustrated in FIG. 4, there are three distinct charging contacts 197, as the implementation utilizes an initial USB-C connection, as is described in more detail below. The USB-C connection, along with the switching circuitry within charging dock 200, dictates that there be three charging contacts 197. In other implementations, more or less charging contacts may be included, such as two, four, or five, depending on the given configuration. For example, a Micro-USB connection may utilize only two charging contacts. Further, in the example implementation illustrated in FIG. 4, the charging contacts 197 include an inner most dot contact, surrounded by a circular contact, and surrounded by another circular contact, as shown. In other words, the charging contacts in this example include a first charging contact, a second charging contact around the first charging contact, and a third charging contact around the second charging contact. However, the present disclosure is not intended to be so limited. For example, in other implementations, the innermost charging contact need not be a dot, and may also be a circle. Further, the circular charging contacts need not be perfect circles or rings, but may merely be elliptical. Although, the circular charging contacts help enable the 360-degree mateability with charging dock 200, as can be understood based on this disclosure.

Lower PCB 196 can include any suitable printed circuit board such as a standard PCB sized to fit inside of audio device 100. In an example implementation, charging contacts 197 are electrically connected through and/or on the PCB (e.g., using electrical vias), and lines are routed out beyond the charging contacts 197 to solder paths, which can be connected to the upper PCB (e.g., power board) 192. Upper PCB 192 can electrically route to the battery charger and a switch circuit, as the charging contacts 197 may be in parallel with the alternative charger, such as the USB plug-in port accessible via charging port access 134 on the back of audio device 100. Understandably, charging port access 134 leads to a charging port for audio device 100. The switch circuit within audio device 100 detects which of the two charging methods are present to manage the charging, and control instructions or a computer program may be included in audio device 100 to manage how to charge if both charging methods are providing power (e.g., only pull power from one of the charging methods).

Lower PCB 196, in addition to supporting charging contacts 197, provides mechanical support for the internal componentry of audio device 100. In some implementations, a sealing member is present between the lower PCB 196 and the underlying external bottom cap 130, to help seal the interface between the external bottom cap 130 (specifically, the mating portion 132) and the lower PCB 196. The sealing member may be a gasket, such as a rubber gasket or a foam gasket (e.g., penguin foam gasket), or it may be an adhesive that also acts as a sealing member, in some examples. Where employed, the sealing member can provide water/liquid resistance (e.g., at least IPX4 liquid ingress protection) or water proofing (e.g., at least IPX7 liquid ingress protection). The sealing member can be held within the device assembly via a compression fit and/or it can be fastened to one or more surfaces.

As shown in FIG. 4, a portion of a surface of lower PCB 196 is the external surface of audio device 100. In more detail, a portion of the lower surface of lower PCB 196, along with charging contacts 197, comprise a bottom-facing surface of audio device 100. Understandably, the remainder of lower PCB 196 is within the main housing of audio device 100 (which includes external bottom cap 130). However, the surface is not the bottom-most surface of audio device 100, as that surface is the bottom surface of foot 135. Instead, the exposed portion of the surface of lower PCB 196 is raised, to help protect against damage from contact with other surfaces, liquid exposure (e.g., if the audio device is sitting in water or other liquid), and other elements (e.g., dirt or sand), for example. In some implementations, the portion of the surface of lower PCB 196 that is exposed through the opening in the center of the external bottom cap 130 is painted.

Figure 5:
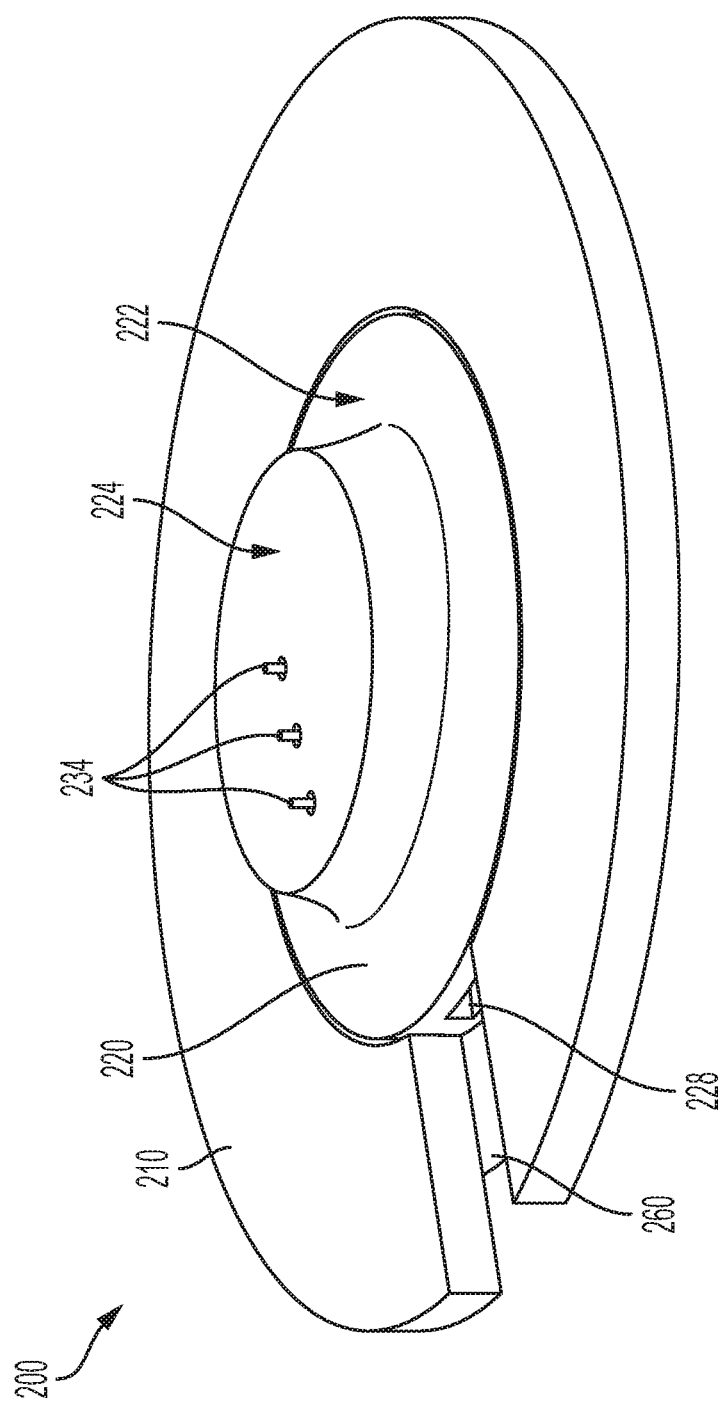
FIG. 5 illustrates a perspective view of a charging dock, according to various implementations.
Figure 6:
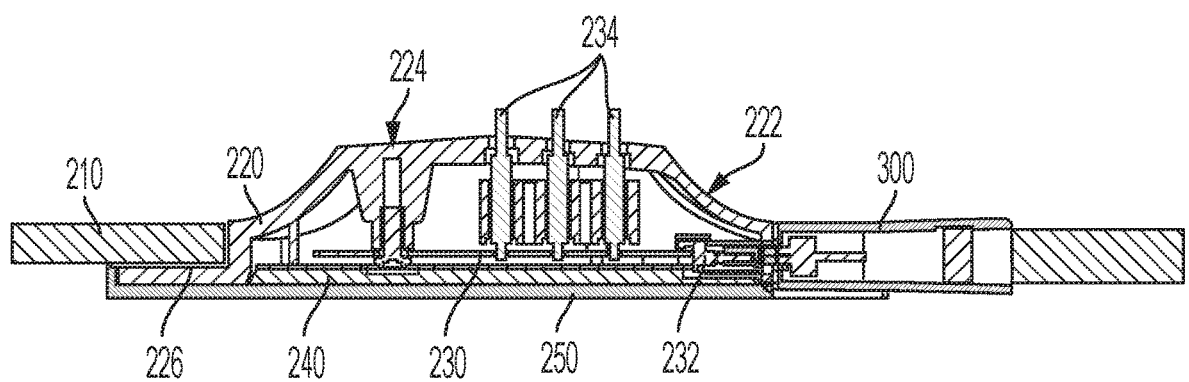
FIG. 6 illustrates a cross-sectional view of the charging dock of FIG. 5.
Figure 7:
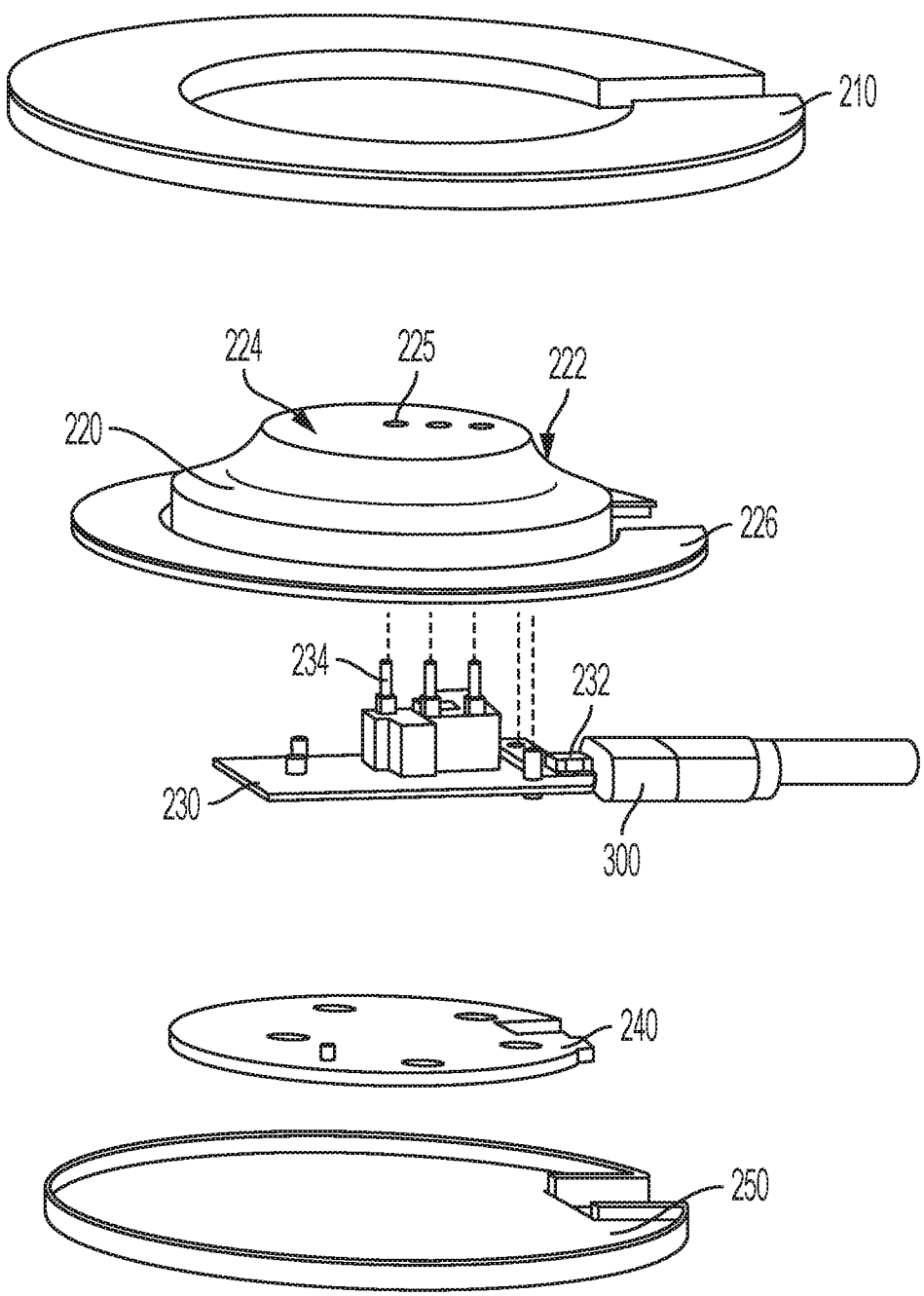
FIG. 7 illustrates an exploded view of the charging dock of FIG. 5.
Figure 8:
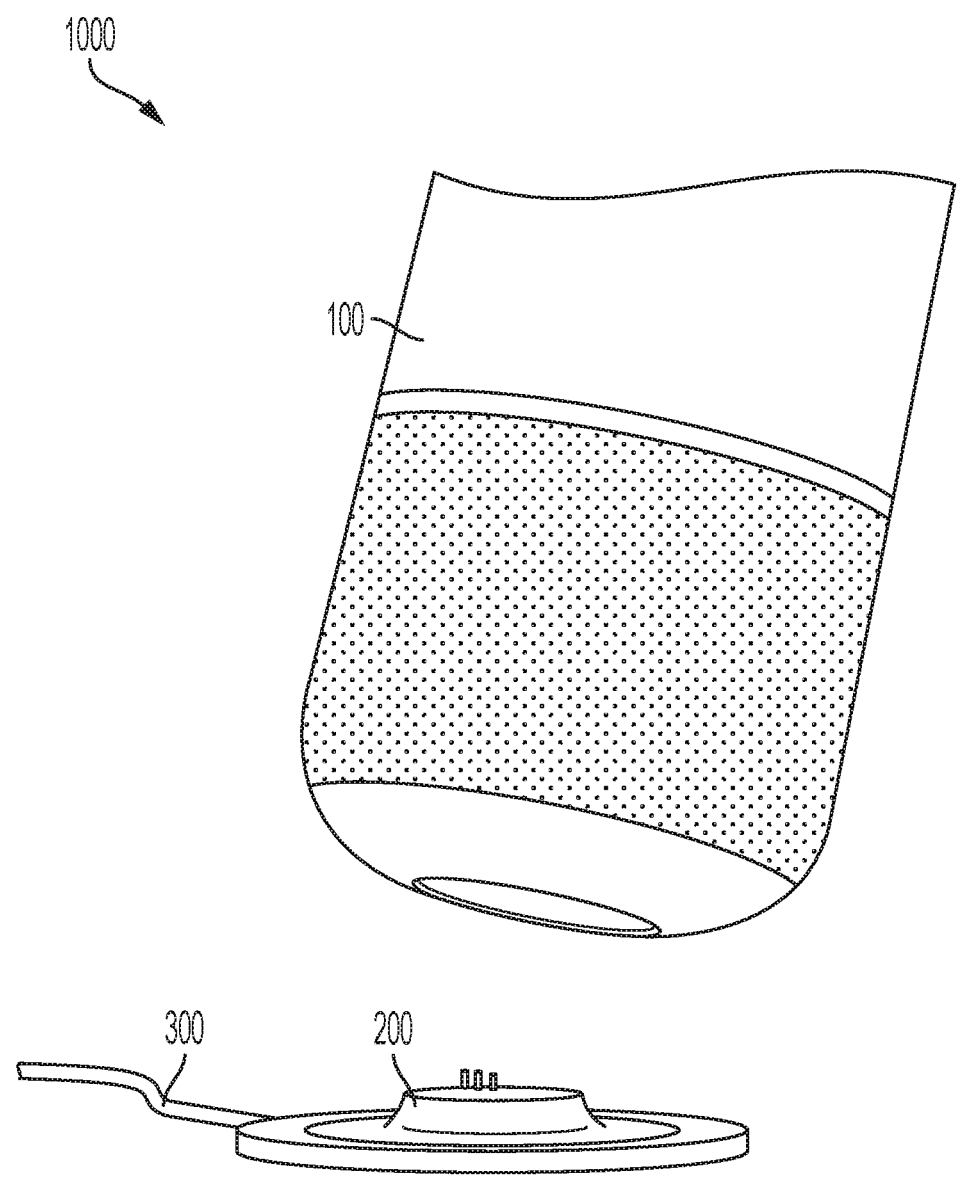
FIG. 8 illustrates a system that includes the audio device of FIG. 1 and the charging dock of FIG. 5.

FIGS. 5, 6, and 7 illustrate perspective, cross-sectional, and exploded views, respectively, of a charging dock 200, according to various implementations. During operation, charging dock 200 is configured to electrically charge audio device 100 when audio device 100 is placed/rested/docked on charging dock 200. For example, FIG. 8 illustrates audio device 100 being placed/rested/docked on charging dock 200, while charging dock 200 is plugged in via cord 300 to electrically charge audio device 100, according to various implementations. Charging dock 200 includes ring 210, core 220, dock PCB 230, internal base 240, and external base 250. Together, core 220 and external base 250 provide the housing for charging dock 200, and internal base 240 provides structural support.

Ring 210 of charging dock 200, in some implementations, is coupled to a lower portion top surface 226 of core 220 using, for example, adhesive, such as very high bond (VHB) tape/fastener. In some implementations, ring 210 includes metal, such as steel, which can add significant weight to charging dock 200 and help keep charging dock from moving too easily (e.g., when audio device 100 is removed from charging dock 200).

Core 220 of charging dock 200, in some implementations, is a housing for dock PCB 230. Core 220 includes openings 225 through which charging connectors 234 (which are pogo pins, in this example) protrude to be exposed for making contact with charging contacts 197 of audio device 100. Core 200 includes a protrusion 222 that has a curved profile terminating at a top surface 224. The protrusion 222 acts as a mating feature for the mating feature 132 of audio device 100. In other words, protrusion 222 of charging dock 200 is configured to fit inside of and mate with the concavity 132 at the bottom of audio device 100. In this example implementation, protrusion 222 has a shape similar to that of a plateau or closed volcano, but other implementations can utilize other suitable shapes, such as one or more posts or rings, for example. The top surface 224 of core 220 in this example implementation is curved for aesthetic purposes. Other implementations can have a flat top surface 224, to better fit with the flat profile of lower PCB 196 with which it interacts when audio device 100 is docked on charging dock 200.

Dock PCB 230 can include any suitable printed circuit board, such as one shaped to fit within core 220. As shown in FIGS. 6 and 7, dock PCB 230 includes charging port 232, which is configured to receive charging cable 300 via charging port access 228 (shown in FIG. 5). In this example implementation, charging port 232 and charging cable 300 are both USB-C configured, which can enable higher and/or faster charging rates. However, other implementations may utilize other connections, such as a Micro-USB configuration.

Dock PCB 230 supports charging connectors 234, as shown in FIGS. 6 and 7, which in this example implementation are pogo pins. Pogo pins are spring-loaded pins that can help ensure physical contact with charging contacts 197 of audio device 100 when the device is rested on, or otherwise mated with, charging dock 200. However, other implementations may employ other charging connectors 234, such as other pins or posts, for example. As can be understood based on this disclosure, the spacing of the charging connectors 234, which are pogo pins in this example, can be selected to coincide with the spacing of charging contacts 197, such that the features are relatively centered with each other when audio device 100 is mated with charging dock 200. In other words, each pogo pin 234 location can be selected such that each pogo pin is centered with a corresponding charging contact 197 (where centered for one of the ring charging contacts 197 means that it is in the center of the thickness of the ring). Such a configuration allows audio device 100 to be charged when placed on charging dock 200 at any axial orientation, and further allows rotation of audio device 100 on charging dock 200 without affecting the charging operation, thereby enabling 360-degree docking ability.

Dock PCB 230 includes switching circuitry to manage a USB-C connection, in some implementations. USB-C connections include first and second configuration channel (CC) lines or pins (CC1 and CC2), which are used to establish and manage a source-to-sink connection. The CC lines are how USB-C implements the ability to flip the connector, such that it is orientation agnostic and can be plugged in either way (i.e., one way, or relatively upside down, as opposed to Micro-USB that needs to be plugged in with a particular orientation). As the USB-C connector has two CC lines (CC1 and CC2), by monitoring the voltage on both CC1 and CC2, the switching circuit of dock PCB 230 can determine which orientation the cable is in, and route the other wires to ensure all three of the charging connectors (or pogo pins) 234 receive the appropriate connections. In other words, the switching circuit of dock PCB 230 senses the CC line, and then routes the correct one through. Thus, the switching circuit enables there to only be three charging connectors (or pogo pins) 234, as opposed to four. Such a reduction significantly affects the design of the charging dock 200, as well as the audio device 100, enabling both to have smaller form factors (as an additional charging connector 234, and corresponding charging contact 197, is not required). In some implementations, the three charging connectors (or pogo pins) 234 are configured to electrically couple to bus power, ground return, and configuration channel, in some order thereof.

FIG. 8 illustrates a system 1000 that includes audio device 100 and charging dock 200, according to various implementations. As shown, charging cable 300 is plugged into charging dock 200, and audio device 100 is about to be mated with or docked on charging dock 200. Recall that audio device 100 includes first mating feature 132, which is a concavity in the center of external bottom cap 130 (e.g., shown in FIG. 4). Also recall that charging dock 200 includes second mating feature 222, which is a protrusion in the center of core 220 (e.g., shown in FIG. 5). First mating feature 132 is configured to fit with second mating feature 222. In other words, in this example implementation, concavity or female mating feature 132 is configured to fit on protrusion or male mating feature 222. However, the mating features can be reversed such that audio device 100 includes a male mating feature and charging dock 200 includes a female mating feature and/or other mating feature configurations can be employed. Regardless, such mating features can help self-center the audio device to the charging dock, thereby ensuring that a proper connection is made between charging contacts 197 and charging connectors 234. Other benefits of the mating configuration can be understood based on this disclosure, such as increased stability when audio device 100 is docked on charging dock 200, for example.

It is understood that the relative proportions, sizes, and shapes of the audio device 100 and charging dock 200, and the components and features thereof, as shown in the figures are merely illustrative of such physical attributes of these components. That is, these proportions, shapes, and sizes can be modified according to various implementations to fit a variety of products. For example, while a substantially tubular (or circular cross-sectional) shaped loudspeaker may be shown according to particular implementations, it is understood that the loudspeaker could also take on other three-dimensional shapes in order to provide acoustic functions described herein.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. In other implementations, these coupled components can be formed as separate members and be subsequently joined through known processes (e.g., soldering, fastening, ultrasonic welding, bonding). In various implementations, electronic components described as being "coupled" can be linked via conventional hard-wired and/or wireless means such that these electronic components can communicate electricity and/or data with one another. Additionally, subcomponents within a given component can be considered to be linked via conventional pathways, which may not necessarily be illustrated.

A number of implementations have been described. Nevertheless, it will be understood that additional modifications may be made without departing from the scope of the inventive concepts described herein, and, accordingly, other implementations are within the scope of the following claims.

What is claimed is:

1. An audio device comprising:
   a housing;
   one or more loudspeakers within the housing;
   one or more batteries within the housing;
   battery charging circuitry within the housing and electrically coupled to the one or more batteries; and
   a printed circuit board (PCB) at least partially within the housing, the PCB including charging contacts on a surface of the PCB, the charging contacts electrically coupled to the battery charging circuitry,
   wherein the charging contacts and at least a portion of the surface of the PCB form an outer surface of the audio device.

2. The audio device of claim 1, wherein the outer surface of the audio device is a bottom surface of the audio device.

3. The audio device of claim 1, wherein the charging contacts include:
   a first charging contact;
   a second charging contact around the first charging contact; and
   a third charging contact around the second charging contact.

4. The audio device of claim 3, wherein the second and third charging contacts are ring-shaped.

5. The audio device of claim 3, wherein the first, second, and third charging contacts are configured to electrically couple to bus power, ground return, and configuration channel.

6. The audio device of claim 1, wherein the charging contacts are configured to be in electrical connection with a Universal Serial Bus (USB) Type-C (USB-C) connector.

7. The audio device of claim 1, wherein the charging contacts include gold.

8. The audio device of claim 7, wherein the charging contacts are hard gold plated with a gold thickness of 0.5 to 1.5 micrometers.

9. The audio device of claim 1, wherein the surface of the PCB is substantially flat.

10. The audio device of claim 1, further comprising a gasket between the PCB and the housing.

11. The audio device of claim 1, wherein the at least a portion of the surface of the PCB that forms an outer surface of the audio device is painted.

12. The audio device of claim 1, wherein the audio device is configured to rest on a charging dock, the charging dock including three electrical pin connections configured to make physical contact with the charging contacts when the audio device is rested on the charging dock.

13. The audio device of claim 1, wherein the housing includes a concave portion originating at a bottommost surface of the housing and terminating at an opening, the opening exposing the at least a portion of the surface of the PCB and the charging contacts.

14. An audio device comprising:
    a housing;
    one or more loudspeakers within the housing;
    one or more batteries within the housing and electrically coupled to the one or more loudspeakers;
    battery charging circuitry within the housing and electrically coupled to the one or more batteries; and
    a printed circuit board (PCB) at least partially within the housing, the PCB including charging contacts on a surface of the PCB, the charging contacts electrically coupled to the battery charging circuitry,
    wherein at least a portion of the surface of the PCB in combination with the charging contacts form a bottom-facing, outer surface of the audio device, and
    wherein at least one of the charging contacts is elliptical.

15. The audio device of claim 14, wherein the at least one of the charging contacts is circular.

16. The audio device of claim 14, wherein the charging contacts include a first distinct charging contact, a second distinct charging contact inside of the first distinct charging contact, and a third distinct charging contact inside of the second distinct charging contact.

17. A system comprising:
    an audio device including
      a housing,
      one or more loudspeakers within the housing,
      one or more batteries within the housing,
      battery charging circuitry within the housing and electrically coupled to the one or more batteries, and
      a printed circuit board (PCB) at least partially within the housing, the PCB including charging contacts on a surface of the PCB, the charging contacts electrically coupled to the battery charging circuitry; and
    a charging dock including electrical connectors configured to make physical contact with the charging contacts of the audio device in any relative radial orientation about an axis when the audio device is engaged with the charging dock.

18. The audio system of claim 17, wherein the electrical connectors of the charging dock are spring-loaded pins.

19. The audio system of claim 17, wherein the axis is the main axis of the housing of the audio device.

20. The audio system of claim 17, wherein the charging dock includes a switching circuit configured to
    sense the configuration channel of a received Universal Serial Bus (USB) Type-C (USB-C) connector in either orientation, and
    route the sensed configuration channel of the USB-C connector to at least one of the electrical connectors of the charging dock.

* * * * *